United States Patent
Landman et al.

(10) Patent No.: US 9,295,165 B2
(45) Date of Patent: Mar. 22, 2016

(54) SELECTIVE APPLICATION BY ELECTROLESS PLATING OF A TIN-WHISKER IMPENETRABLE METAL CAP TO METALS ON ELECTRONIC ASSEMBLIES

(75) Inventors: Robert J Landman, North Hampton, NH (US); J. Gordon Davy, Peoria, AZ (US); Dennis Fritz, Brookville, IN (US)

(73) Assignee: LDF Coatings, LLC., North Hampton, NH (US)

( * ) Notice: Subject to any disclaimer, the term of this patent is extended or adjusted under 35 U.S.C. 154(b) by 500 days.

(21) Appl. No.: 13/204,614

(22) Filed: Aug. 5, 2011

(65) Prior Publication Data

US 2012/0195016 A1   Aug. 2, 2012

Related U.S. Application Data

(60) Provisional application No. 61/371,670, filed on Aug. 7, 2010.

(51) Int. Cl.
*H05K 1/11* (2006.01)
*H05K 3/34* (2006.01)
*H05K 3/24* (2006.01)

(52) U.S. Cl.
CPC .............. *H05K 3/341* (2013.01); *H05K 3/243* (2013.01); *H05K 2201/10977* (2013.01); *H05K 2201/10992* (2013.01); *Y02P 70/613* (2015.11)

(58) Field of Classification Search
USPC ......... 174/261, 250, 255–257, 263; 427/98.4, 427/98.5, 98.6, 99.2, 99.5, 304, 313, 404, 427/405, 437, 443.1
See application file for complete search history.

(56) References Cited

U.S. PATENT DOCUMENTS

| | | | |
|---|---|---|---|
| 3,625,758 A * | 12/1971 | Stahl et al. ................. | 428/206 |
| 6,361,823 B1 * | 3/2002 | Bokisa et al. ............... | 427/97.3 |
| 2011/0017702 A1 * | 1/2011 | Waugh et al. ............... | 216/13 |
| 2012/0090880 A1 | 4/2012 | Kline | |

* cited by examiner

*Primary Examiner* — Tremesha S Willis
(74) *Attorney, Agent, or Firm* — Fleit Gibbons Gutman Bongini & Bianco PL; Jon A. Gibbons

(57) ABSTRACT

Since lead-tin solder was outlawed, electronic circuits constructed with lead-free tin solders have been plagued growth of whiskers of tin emanating from the tin soldered and/or tin coated surfaces. Such whiskers often short out the electronic circuits when present. The growth of tin whiskers in such electronic circuits (i.e., those fully or partially populated with components is addressed here by depositing a tin-whisker-impenetrable metal cap on all exposed tin coated surfaces in the circuit.

In the process, metal surfaces where no cap is desired are masked, where after all exposed metal surfaces are cleaned, followed by immersing the entire circuit in an electroless bath, e.g., a nickel electroless bath, for a time sufficient to form a metal cap on all exposed metal surfaces, removing the circuit from the bath, rinsing and de-masking covered surfaces.

15 Claims, No Drawings

SELECTIVE APPLICATION BY ELECTROLESS PLATING OF A TIN-WHISKER IMPENETRABLE METAL CAP TO METALS ON ELECTRONIC ASSEMBLIES

BACKGROUND OF THE INVENTION

This background presents the various means that have used to deal with the whisker problem. Only a few means prevent whisker risk. (Not knowing of any prevention means, advocates for the rest (discussed below) have acknowledged that their means only mitigate.)

Since the beginning of electronic product manufacturing, tin-lead (Sn—Pb) solder (commonly the eutectic alloy) has been used virtually exclusively to make the interconnections between the electronic components (e.g., transistors, sockets, resistors, diodes, capacitors, integrated circuits, and the like) that comprise the assembly. This solder has a convenient melting temperature and provides reliable and reparable connections. More recently, a Sn-based solder containing small amounts of silver (Ag) and copper (Cu), but no Pb, has become widely used.

Fabricated Boards

When electronic assembly design switched from vacuum tubes to "solid state" design, in place of terminals and wires, an insulating "bare" (i.e., unpopulated) circuit board with etched cooper "lands" and "traces" was introduced, and continues in use today. It provides a mounting platform for the components, with the lands as the solder-connection sites for the component terminations, and the traces making the interconnections between the lands. (The industry refers to making a bare board as "fabrication.")

At first, component terminations were wires inserted through "vias," holes through the board surrounded by lands at the ends of the copper traces that connect between components. Later, as the size, and spacing between, component terminations diminished, through-hole wires were replaced by much smaller terminations—connection points that, of soldering, not only made the intended electrical connections to the lands but also attached the component to the board. This construction is referred to as "surface mounting".

Finish

Since uncoated copper does not solder well with the soldering fluxes permitted for electronic assemblies, a tin-lead alloy was typically applied over the copper as the "finish" (i.e., the final layer). The finish quickly develops a very thin protective oxide coating, and by protecting the underlying basis metal from oxidation, preserves the "solderability" ability to be wet by solder) of the lands. For the same reason, a solderable finish is also applied over the basis metal of the component terminations (typically a copper alloy or alloy 42).

Until enactment of legislation prohibiting Pb (discussed below), the most widely used finish for boards and component terminations, was a tin-lead alloy. Today, "Pb-free Sn" (the legislation requires that it contain not more than 0.1 percent Pb by weight) is widely used as a finish. As discussed below, this use creates a significant risk that long after the product has entered the field, short circuits will develop by the growth from the Sn of "whiskers."

Boards

Boards are designed and fabricated to customer specification. A number of Pb-free solderable finishes other than Sn are available, so even if an assembler is required to build a Pb-free assembly, a board finished with any one of these options has no whisker risk.

Components

In contrast, components are produced by component manufacturers to their own design and specification. Typically, for a given component, a manufacturer offers only one termination finish, which for about 85 percent of the components is Pb-free Sn.

Assembly and Soldering

By far the most common process to produce an electronic assembly (i.e., a board populated with components) is known as "surface-mount reflow":

(1) Apply to each land of the board a controlled amount of solder paste (comprised of tiny solder balls, flux, and other ingredients), (2) Position each component on its intended site, its terminations aligned with the lands and contacting the solder paste, (3) Heat the assembly above the solder's melting temperature. The solder reflows and wets lands and terminations to form the intended connections.

(4) After cooling, some assemblies are then cleaned to remove residues; if a so-called "no-clean" flux is used this step may be omitted.

A number of terms other than "electronic assembly" are in common use, including "circuit assembly," "circuit card," and just "card." Because of ambiguity, the term "board" to refer to a populated (rather than bare) board should not be used.

Pb Prohibition and its Consequences

Out of a stated public-health concern for the toxicity of lead (Pb), 2003 certain government entities enacted legislation that has the effect of prohibiting the use of Pb both in solder and the termination finish of boards and components. (The prohibition applies directly not to these items, but to most categories of electronic equipment put on the market.) As a result, the industry has undergone a revolution in materials and processes for assembling Pb-free products.

At customer request, some board fabricators began to use a Pb-free Sn or high-Sn alloy. Concurrently, as customer demand for lead-free components grew, most component manufacturers, for cost reasons, chose (among other options) to offer Pb-free Sn as the only available finish. (Inventorying more than one finish is too expensive.)

To comply with the Pb prohibition, assemblers of equipment covered by the legislation had to switch to Pb-free solders. Regrettably, after decades of searching, no drop-in Pb-free replacement solder has been found that.

Melts at a suitable temperature, and

Does not contain Sn as a major constituent (which, had one been found, would have avoided the whisker risk).

Even more regrettably, because customers have no choice of component termination finish, even those building equipment not covered by the Pb prohibition find themselves obliged to buy the components they need with a Pb-free Sn termination finish that, because of its whisker risk, they do not want.

These users have the option, of course, to replace the termination finish with conventional tin-lead solder. But this is an expensive proposition, and not without risk:

Small chip components can have the finish replaced by a proprietary process from a single source.

Larger components can have the terminations dipped in solder one side at a time, with the associated (unquantifiable) risks of undetectable damage from the sudden asymmetric heating from dipping the terminations of just one side of the component at a time in solder, or from handling.

Unless contractually required to, most assembly manufacturers today do not replace the termination finish.

Pb-Free Tin: The Extent of the Whisker Problem

While originally Pb was added to the Sn to give a convenient melting temperature, it was later found to have another important attribute. After over a half-century of diligent searching, it has proved to be the only substance that prevents the (often very slow) growth from the Sn of (sometimes very long) filaments, universally referred to as "whiskers."

The mechanism by which Pb prevents whisker growth remains poorly understood, but the Pb must be "in" the Sn (i.e., alloyed with it). Remarkably, Sn whiskers penetrate a 1-μm cap of Pb in days (Ed Li, AEM, Inc., San Diego, Calif., private communication, 2006).

Hence for practical purposes, except where the bill of materials for an electronic assembly has been thoroughly "scrubbed." by experts (and all Pb-free finishes replaced), and the termination composition of every component checked upon receipt, manufacturers of all kinds of electronic assemblies (including those not covered by the prohibition of Pb) now must assume that the assemblies they are building contain Pb-free Sn plating.

In the same way, every purchaser of an electronic assembly must make the same assumption, and that it may also contain Pb-free Sn solder. Consequently, virtually all electronic equipment is at risk of developing Sn whiskers. The longer the intended life of the equipment, the greater the risk that it will fail due to whisker growth.

Sn Whiskers: Symptoms and Etiology

A typical Sn whisker has a thickness in the tens of microinches (i.e., tens of millionths of an inch) and may grow to a length of tenths of an inch (a whisker length of one inch has been documented). Since a typical gap between individual connections in an electronic circuit (such as those on an integrated circuit package) is but a few hundredths of an inch, a whisker can easily grow long enough to cause a short circuit.

Further, while such whiskers are thin, the presence of just one on a circuit capable of supplying enough current may initiate an arc (plasma) that destroys the entire assembly.

Just as the mechanism by which Pb in Sn prevents the growth of Sn whiskers remains mysterious, so too are the causes of growth of whiskers from Pb-free Sn surfaces. Such whiskers will grow in any environment, e.g., with or without gravity or an electric field, over a broad range of temperatures and humidity, in air or vacuum, etc.

Whisker growth from apparently identical specimens may vary widely and unpredictably, in times to onset of formation, growth rates, number of whiskers per unit area distribution of lengths and thicknesses, etc. Whisker-caused short circuits have occurred in some cases after only days or months of manufacture, and in others only after more than a decade.

At the present level of understanding, it appears that the growth of whiskers has many contributing causes. Sn plated directly onto copper reacts with it (by solid-state diffusion) to torn intermetallic compound (IMC) that puts it in compression. It is often claimed that whiskers grow to relieve that stress. However, whiskers also grow from Sn on substrate that do not react with Sn to form an IMC, so even to the extent that explanation is true, it is hardly sufficient.

Because of the many conditions that may result in whisker growth, not all known, and none of which is practical to inspect for, it must be assumed that it will be a long time before users can rest assured that the Sn on all the components they receive will not grow whiskers. Also, the prospects seem dim for any non-capping process that would nullify Sn's whiskering proclivity.

How Many System Failures are Due to Sn Whiskers?

The frequency of occurrence of whisker-caused short circuits remains poorly documented.

A short-circuit event often obliterates all evidence of the whisker that caused it, making it difficult to diagnose.

Because whiskers often grow slowly, any scientific investigation is very time-consuming.

Due to their microscopic thickness, whiskers are difficult for trouble-shooters to detect visually.

Most importantly, manufacturers whose products have been whisker victims are loathe to admit it publicly, lest they face demands for a recall.

As a result, the risk that a give assembly will fail due to a whisker-caused short circuit has proved impossible to quantify.

Mitigation on Boards and Components

While the current invention involves plating, it differs qualitatively from the prior art of plating bare boards and component terminations. Applicants, who each have decades of experience in electronics manufacturing, could find no prior art of applying plating to an electronic assembly, for the disclosed purpose, or for any other. Given the magnitude of the whisker problem, had the practice of capping Pb-free Sn with an impenetrable metal been used, it would have become well-known within the industry.

As for plating components and bare boards, there are many cases of prior art, but none that relate to the present invention. For example, U.S. Pat. No. 5,882,736 teaches the deposition of palladium onto copper substrates of unpopulated circuit boards, to achieve improved wire bonding of components subsequently attached to the circuit board, to populate it.

(Wire bondability is rarely a concern for bare boards, since most connections are made with solder, not by bonding wires. Where it is a requirement, palladium is generally used due to its lower cost compared to other noble metals.)

The '736 patent asserts that the resulting layer of palladium on the copper substrate limits the formation of the intermetallic compound of Sn and copper (Cu) that would otherwise form when Sn is plated (or soldered) directly onto copper.

Various baths for the chemical deposition of metal layers are known in the art (e.g., for palladium, U.S. Pat. No. 4,424, 241, U.S. Pat. No. 3,418,143, U.S. Pat. No. 3,754,939, DE-OS 42 01 129, GB-PS 1,164,776, DE-OS 30 00 526, U.S. Pat. No. 4,341,846, U.S. Pat. No. 4,255,194, DE-OS 28 41 584, and EP-0 423 005 A1). For many metals, electroless plating bath chemicals are commercially available. (The Appendix shows chemical reactions believed to occur in an electroless nickel plating bath.)

Mitigation by Underplating Component Termination Finish

To counter the whisker risk from Pb-free Sn, some component manufacturers pre-plate onto the termination basis metal (usually Cu or alloy 42) a layer of another metal, most commonly nickel (Ni), as a diffusion barrier before the Sn finish is applied. (See for example "Understanding Whisker Phenomenon: Driving Force for Whisker Formation" by (Then Xu, Yun Zhang, C. Fan and J. Abys.)

However, depending on the barrier's characteristics, this approach has reduced whisker growth in some situations, and enhanced it in others. Termination forming after plating may crack a brittle Ni underlayer, resulting in loss of its barrier property and actually promoting whisker growth.

Just as the component purchaser has no practical way to assess the quality of the Sn, he has no practical way to evaluate the underplating, and hence no way to know whether it mitigates or aggravates whisker risky. No one claims that it eliminates whisker risk.

Mitigation by Polymer-Coating Assemblies

Assembly manufacturers have had few whisker-mitigation options applicable to entire soldered electronic assemblies. If a manufacturing process, applied to an assembly, were able to prevent, and not just mitigate, whisker risk, it would obviate specialists' "scrubbing" the bill of material and inspecting for Pb-free Sn on incoming components, a practice widely found in high-reliability electronics manufacturing today.

The simplest and least expensive risk-mitigation technique has been to depend on the conformal polymer coating that is widely applied to the assembly anyway (especially on high-reliability assemblies intended for long service life). A conformal coating is applied to an electronic assembly designed to operate in a humid environment to reduce the risk of corrosion and electrochemical migration (dendritic growth), which can result in a short circuit.

(Dendrites and whiskers are entirely separate phenomena. Dendrites grow in the presence of moisture and a DC electric field on an insulating surface between uncoated conductors. Whiskers grow, in any direction, out of the surface of a metal subject to whiskering, with no moisture or field required.)

However, commercially available conformal coating materials are formulated to prevent dendritic growth, not to resist penetration by whiskers. In fact, whiskers have been found to penetrate some conformal coatings within months. Even the most whisker-resistant coating formulations, applied, as specified, to a "flat, unencumbered surface" 1-2 thousandths of an inch thick, are penetrated within a few years.

An added difficulty is that the coating achieved by spraying, the most widely used application method, is much thinner, or even absent, on shadowed surfaces (e.g., the back side of terminations) and (due to surface tension effects) along the edges of rectangular component terminations.

Acrylics, the easiest of the conformal coatings to apply and remove for rework or repair), are also among the most easily penetrated. Thus, an engineer choosing to use conformal coating for the additional function of mitigating whisker risk may have to compromise between manufacturing convenience and penetration resistance.

The mechanical properties of all polymers vary (reversibly for many) with temperature and humidity. This includes the relevant properties of those used for conformal coating (adhesion to the substrate, pliability vs. brittleness, whisker penetration resistance, etc.). Also, beyond certain limits, temperature, humidity, and age can cause irreversible deterioration that lessens a coating's whisker penetration resistance. A coating's variability and susceptibility to deterioration are rarely investigated, by supplier or user.

Parylene™, applied in a vacuum chamber by a process that ensures total coverage, has been found to be among the most whisker-resistant coatings. (It has the disadvantage that it cannot be removed by a solvent for rework and repair.) Even Parylene coatings have been penetrated within a few years, and that is with test specimens held at or near room temperature. Hence, commercially available conformal coatings are at best whisker-resistant, not whisker-impenetrable—risk mitigators, not eliminators.

Despite the shortcomings of polymer conformal coatings, they do mitigate whisker risk. For a penetrating whisker to actually cause a short circuit, one of two events each fairly unlikely if the conformal coating coverage is complete) must occur:

It must meet another whisker from a surface at a different electrical potential that has also penetrated the coating, OR It must penetrate the conformal coating over a metal at a different electrical potential, not from below, but from the outside.

Prevention by Polymer-Coating Assemblies

A branch of the US Missile Defense Agency has been funding efforts to formulate a polymer conformal coating, known as "Whisker-tough"™, expressly for penetration resistance. The impenetrability results, not from its rigidity, but from its resilience and tailored adhesion strength. By design, an advancing whisker lifts, or "tents," the coating away from the surrounding Sn surface until it gets so long that the resistance force from the coating buckles it and re-directs it back towards the surface.

Application is simple (although it does differ from the most widely used method—spraying). An assembly is immersed in the liquid "Whisker-tough"™ coating material, and the excess is allowed to drain off. The material includes a thixotropic agent to ensure edge coverage. The coating is air-cured first at room temperature and then in an oven. MDA hopes that the formulation will serve as a drop-in replacement for conventional conformal coatings, including ease of application, so that it can permit the use of Pb-free Sn finishes and solder in the systems it buys.

However, it, like other polymer systems, is subject to (reversible or irreversible) changes in its properties at temperature and humidity extremes, and irreversible changes with age. The influence of these variables has yet to be investigated. (Steve Smith, Whisker-Tough LLC private communication, 2011.)

Prevention by Ceramic-Coating Assemblies

A vacuum process for depositing a (non-polymer) very thin whisker-impenetrable ceramic cap on all assembly surfaces has become available from Sundew Technologies. Although Sundew's atomic layer deposition process has been used for a number of years in electronic chip device fabrication, its use for producing a whisker-impenetrable cap is recent.

The cap's composition can be to within limits, to give desired physical properties (e.g., resilience, yield stress). If undamaged during handling, the cap is virtually unaffected by temperature, humidity and age. Such coatings have been shown to prevent whisker penetration for more than one year.

Surface preparation to ensure good adhesion of the ceramic film to the many different materials present in an assembly (at least all the Pb-free Sn and Sn rich alloys) is a requirement of unknown difficulty. (For most assemblies, adhesion to surfaces other than Sn may not be important. Any film that flaked off from them would not impair performance or reliability, and being so thin, might not even be noticed.)

The size of the cap's thickness safety margin is not yet known. A coating too thin would be punctured by a Sn whisker or damaged during handling, while even with adequate surface preparation, due to expansion coefficient differences, a coating too thick would fracture during temperature cycling.

PRESENT INVENTION

Prevention by Selective Metal-Coating Assemblies

Two whisker prevention means have been presented: applying to all exposed surfaces (including all exposed Sn) of a functional electronic assembly a whisker-impenetrable polymer or ceramic cap. The present invention involves a simple and inexpensive (materials, equipment, and labor) process of immersing all exposed surfaces of a functional electronic assembly in an electroless plating bath that deposits a whisker-impenetrable metal cap selectively onto all Sn (and, unimportantly, some other metals), while leaving oil insulating surfaces unchanged.

Because the cap is applied not before soldering (as would be the case if the component manufacturer or the assembly manufacturer applied it to component terminations) but after, it need not be solderable.

Candidate Metal Deposition Processes

The requirement for selective metal capping eliminates any kind of vapor deposition as a candidate process. The three types of plating processes conducted in aqueous (i.e., electrically conductive) baths are discussed next, with the one enabling process last.

Electroplating

Electroplating, which might appear to be a possible means of applying the cap layer, requires a supply of DC current. Driven by the current source, ions from a metal anode accept electrons from a metal cathode to grow a film of the anode metal on the cathode. However, this process is impractical because the numerous metal surfaces on assemblies that are already populated with components that are not all connected together electrically.

Immersion Plating

Immersion plating, which does not require a source of electrical current, also is not acceptable. In such a process certain metals, including copper and gold will deposit on many metals by an entirely chemical process known as "redox" or "replacement". For each deposited atom, one or two atoms of the substrate dissolve and go into solution.

However, the deposit thickness of immersion plating is self-limiting. Once the depositing metal has fully coated the substrate metal, there is no further opportunity for the substrate metal to dissolve and go into solution. The process stops before an adequately thick cap can grow.

(Coating thicknesses of so-called "immersion tin" exceeding 1 μm have been reported. Despite its name, it must be concluded that the true mechanism is actually electroless, as discussed next.)

Electroless Plating

Electroless plating meets the stated requirements and enables the practice of this invention. This deposition method is also known as chemical or auto-catalytic plating. It is a non-galvanic method (i.e., without a supply of electrical current) involving several simultaneous chemical reactions (see Appendix) in an aqueous solution. Electroless plating can be made to coat insulating surfaces, but only by taking special measures that for this application are unwanted.

This is the concept that enables the selective metal capping of Sn on an electronic assembly: Electroless metal plating occurs only on certain metals, including Sn, and not at all on insulating surfaces.

First Choice—Nickel (Ni)

Chemical solutions for electrolessly plating a number of metals have long been commercially available, with Ni being one of the most common. Electroless metal plating is well known to be quite effective in coating tin.

Of the various choices of electroless metals that applicants might have investigated, Ni has three attributes that made it the first choice:

(1) It is substantially less expensive than many other candidates.

(2) Its rate of reaction (by solid-state diffusion) with the underlying Sun to form an intermetallic compound is substantially slower than many other candidates. This is important, because nothing was known about IMC whisker penetrability.

(3) It had already been reported (Suganuma et al., see below) that a Ni coating only 200 nm thick prevented whisker penetration for not less than three years, with the minimum necessary thickness unknown.

Other Candidate Metals

While applicants employed an electroless Ni bath in the example, other metals, such as Pd, can also be deposited from electroless baths (see Table) onto the Sn surfaces on an electronics assembly. Electroless baths employing Pd have been previously identified in this specification.

A cap of Pd deposited over another electroless metal, such as Ni, may be found useful. A co-deposited alloy of Pd and Ni, for which a bath is commercially available, is another possibility.

Conformal Coating May Still be Needed

It is not claimed that the use of a metal cap obviates a polymer conformal coating. The latter would likely be needed to prevent dendritic growth in humid environments. But the polymer can be selected without regard for its ability to resist whisker penetration—in other words, solely for its effectiveness in preventing dendritic growth and its ease of application and removal. This is a benefit for those who must now look to a conformal coat to provide protection from the growth of both dendrites and whiskers.

From this invention disclosure, other objects and advantages will be obvious to those skilled in the art.

SUMMARY OF THE INVENTION

Applicants have found, in the broadest sense, that an electronic assembly, as a unit, with some or all of the components necessary for its operation already connected to the assembly with Sn solder connections (with or without lead (Pb) as a constituent), can be protected from tin-whisker caused short circuits by applying a cap layer, composed of one or more layers of electroless metal of adequate thickness, over all exposed Sn (solder or termination finish).

Any components that are not compatible with the process (e.g., switches aid sockets for ICs with gold plated contacts) can be soldered to the assembly after treatment by the disclosed process.

The process steps are:

(1) Mask any metal for which a metal coating is unwanted, (2) Clean such assembly, including exposed metal surfaces, (3) Immerse the entire assembly into an electroless plating bath for depositing the intended metal, (4) Provide sufficient dwell time of the assembly in the bath to plate all exposed Pb-free Sn and high-Sn alloys with a cap of metal of intended thickness, (5) Remove the assembly from the bath, (6) Rinse dragged-out bath constituents off the assembly (including the just-deposited cap), (7) If more than one metal layer is to be deposited, repeat steps (3) to (6) for each additional layer.

(8) Dry, and (9) Remove any masking.

Upon completion of the above-described process, since the resulting cap does not deposit on insulating surfaces, and hence does not impede the electrical functions of such assembly, the assembly can be used as is.

The scope of this invention includes electroless deposition of more than one layer. It should be clear that a second metal can be electrolessly deposited either:

(1) Concurrently with the first (i.e., as a co-deposited alloy), or (2) Subsequently, (i.e., as a second cap layer)

This patent application applies to any electronic assembly upon which one or more electroless metal cap layers have been applied to metal surfaces after soldering.

It is to be understood that not every metal that can be electrolessly deposited is suitable to prevent Sn whisker penetration. (Cu is a known counter-example.) Electroless depositability and impenetrability are separate properties.

DESCRIPTION OF THE PREFERRED EMBODIMENT

During the investigation of the invention, applicants employed an operating video card removed from a personal computer. The exposed surfaces of Pb-free Sn termination finish and solder connections on the card were then coated with a Ni cap in an electroless bath. They then reinserted the card in the personal computer and verified that, as expected, it functioned as before. Many other assemblies have also been treated and tested similarly, with none failing.

Example 1

A Video Card Treatment

A previously unused PC video card was inserted into an operating personal computer, found to function properly, and removed. The gold-plated board edge connectors and sockets of the VGA video connector were masked with plater's tape, and the sides and back of the video connector were then masked with liquid solder mask.

To ensure that the coating to be applied would adhere properly to the Sn surfaces, any foreign and loosely adhering materials on the card were removed by mildly agitating successively in basic and acidic solutions for ten to thirty seconds.

In this case the basic solution was a commercially available solution of cleaner, BIX TSP Concentrate purchased from W. M. Bar & Company Inc. of Memphis, Tenn., diluted per the manufacturer's instructions, one part BIX to six parts water. Upon removal, the card was rinsed in running tap water, immersed in a ten percent solution of sulfuric acid, and again rinsed in running tap water.

After cleaning, the entire card was fully immersed in a commercially available "mid-phosphorus" electroless Ni bath purchased from Heatbath Corporation of Orchard, Mass. as NITEC®9500. A bath was mixed employing 6% by volume of Nitec 9500A, 15% volume of Nitec 9500B and 79% distilled water. This bath was operated as recommended by the manufacturer at 190±2° F. for the duration of the immersion. During deposition, innumerable tiny hydrogen bubbles could be seen rising from the metal surfaces. This is a well-known and useful indicator of electroless metal deposition.

After the card was in the bath for one hour it was removed and rinsed in running tap water, blown dry with air, and the masking necessary to make connections was removed. Thereafter the card was re-inserted into the slot connector in the computer motherboard, and a video monitor was re-attached. The electrical function of the video card was found to be unaltered after the process described.

According to the manufactures product literature for the subject bath, under the deposition conditions of one hour, a Ni cap of a thickness of 0.001 inch (25 µm or 25,000 nm) can be expected to be deposited.

For testing purposes, the card was removed periodically during the one-hour dwell time in the bath. Upon each removal it was rinsed, air-dried, inspected, reinserted into the computer, and tested for functionality. After each re-insertion no loss of function was found. The rinsing, which lasted on a few tens of seconds, used ordinary tap water followed by de-ionized water (both unheated).

After each subsequent removal the video card was re masked as necessary and reinserted into the bath to complete the one-hour hour dwell time. Inspection of the card indicated the presence of a Ni coating on exposed metal surfaces, later confirmed by X-ray fluorescence.

DISCUSSION

Surface Preparation

Alternative cleaners such as solutions of trisodium phosphate can be used in place of BIX to remove adventitious organic contamination. The sulfuric acid cleaning step is intended to neutralize the basic solution and remove any $SnO_2$ on Sn surfaces, allowing the Ni deposit to proceed. (Removing $SnO_2$ may be an important step where the Sn surface is old.)

Electroless Ni

Electroless processes rely on the presence in the bath of a reducing agent, for example sodium hypophosphite ($NaPO_2H_2$), well known to photographers as "hypo." It reacts with the metal ions to deposit metal.

"[Where hypophosphite is the reducing agent] . . . alloys with different percentage of phosphorus, ranging from 2-5 (low phosphorus) to up to 11-14 (high phosphorus) are possible." (Wikipedia) In this example, an electroless bath of medium phosphorous content was used.

The percentage of phosphorus in the deposit affects the metallurgical properties. Among the benefits of high-phosphorus electroless Ni is superior corrosion protection. High-phosphorus Ni is also not ferromagnetic; this may be of benefit for an assembly operating at gigahertz frequencies or with very high switching speeds.

A number of military and industrial standards exist for electroless Ni plating. Deposits are often given a post-treatment of trisodium phosphate or chromate to lessen the effects of corrosion and to ensure that the coating is robust enough for industrial use. Such treatments may also reduce the growth of Sn whiskers through defects, if any, in the Ni cap taught by this disclosure.

Should corrosion of Ni be a special concern, it can be co-deposited with, or given a cap of, palladium or other highly corrosion-resistant noble metal. Depending on the particular electroless Ni bath employed and bath conditions, deposits can vary in such attributes as ductility and porosity; dwell times from less than a minute to an hour may be useful for depositing a whisker-impenetrable cap.

Solderability not Required

Although some of the whisker-impenetrable cap metals that can be electrolessly deposited are quite solderable (Au, Pd), not all are. In particular, Ni is unsolderable. However, solderability is not a requirement of the electrolessly deposited cap. The metals applied over all exposed Sn of soldered connections and component terminations on electronic assemblies are chosen for their whisker impenetrability after soldering, when Sn is no longer needed to preserve solderability.

Effect on Rework

The cap does not interfere with rework (melting a solder connection). Once the underlying solder has melted, the connection's cap is far too thin to impede breaking it. The cap simply and quickly dissolves into the solder.

How Thick Must the Ni Cap be? not Very!

While in Example 1 the total immersion time of the card in the bath was one hour, much shorter dwell times in the bath give a cap thick enough to prevent whisker penetration, by a large safety margin.

According to a paper by Suganuma et al., ("Prevention of Sn Whisker Formation by Surface Treatment of Sn Plating", 136th *TMS Annual Meeting & Exhibition*, Orlando, Fla., 25 Feb.-1 Mar. 2007), a continuous electrodeposited cap of Ni only 200 nm thick prevented any Sn whisker penetration for not less than three years. 50-nm thick coatings of Au and Pd had not been penetrated after two years. (A 50-nm thick Ni deposit was found to be discontinuous, so its impenetrability could not be determined.

Prof. Kim., second author of the above-cited paper, emailed applicants in 2010 stating that still no whisker had penetrated (making the duration of prevention for Ni not less than six years).

More recently, a (sputter-deposited) 35-nm Ni cap (comprised of only about 100 layers of atoms) allowed just one whisker; length 1.81 μm (>0.007 inches, or roughly a half-million atoms!), to penetrate in over three months (thicker caps showed no penetration). The whiskers on the specimen's control side (uncapped Sn) were much shorter, and far more numerous, Mean length was 5.4±4.4 μm: the density exceeded $10^4$ per square centimeter. (Erika Crandall and Prof. Mike Bozack, Auburn University, private communication, 2011).

Presumably, that one whisker was able to grow so much longer than those on uncapped Sn because there were no nearby whiskers to compete for Sn atoms in the plating. It is reasonable to conclude from the sole whisker's long length (and, enormous ratio to the mean length on the uncapped side) that shortly after deposition, it penetrated at a vulnerable site. This establishes that 35 nm is the minimum thickness of Ni needed to prevent whisker penetration. (That is, Ni's penetrability value is 3.5 nm.)

Not all metals show such whisker impenetrability.

A much thicker (600 nm sputter-deposited) Cu ledge over Sn was penetrated by a whisker in just three days. (L. Reinhold et. al., J. Mater. Res., Vol. 24, No. 12, December 2009).

Whiskers invariably penetrate a 1-μm (electrodeposited) Pb cap on Sn in days. (Ed Li, AEM, Inc., private communication, (2006).

The cap resulting from the one-hour Ni deposition was three orders of magnitude thicker than the Ni penetrability found by Crandall and Bozack. Stated alternatively, applicants believe that a well time of less than one minute in an electroless Ni bath will produce, with an immense safety margin, a cap that will permanently prevent even one Sn whisker from penetrating.

Will the Process Harm the Assembly?

While admittedly unconventional, and despite one's possible initial misgivings, upon reflection it should be unsurprising that immersion of soldered assembly in an electroless Ni bath is not risky. To remove flux residues, electronics manufacturers routinely, and without concern for reliability impairment, expose just-soldered assemblies to hot aqueous solutions and then water-rinse them. Any assembly that can withstand such cleaning can without risk survive the electroless process.

As presented in Example 1 of the preferred embodiment, applicants have demonstrated that a functioning electronic assembly can be immersed for a time far longer than necessary to produce an impenetrable coating without impairing the assembly's electrical function. As expected, even with the prolonged plating time, there were no short circuits. This demonstrated total absence of metal deposition onto insulating surfaces.

Other assemblies, when tested for residual contamination, showed adequate rinsing to be easily accomplished. (That is, measured levels of ionic contamination were acceptably low).

Such results are only to be expected from a commercial product intended for wide use in electronics manufacturing (i.e., board fabrication). This process has been applied, without a failure, to many dozens of assemblies.

In sum, the safety of subjecting an electronic assembly to the metal cap process is demonstrated by
The low residual contamination, and
The unbroken success record of assemblies functioning following immersion and ordinary rinsing.
Efficacy It is not possible to accelerate whisker growth. Hence, scientific analysis must substitute for direct proof (i.e., waiting) supporting the claim that a coating by the disclosed process remains impenetrable for, say, thirty years.

1. Cap Metal Properties are Invariant

Unlike polymers, the metals (including Ni) being discussed here as suitable for whisker prevention do not deteriorate with age, temperature, or humidity. At most, they need only be protected from corrosion in the field environment.

Apart from Fe, and to a lesser extent Ag, neither of which has a known penetrability value, corrosion resistance is an attribute of electrolessly depositable metals, as are hardness and shear modulus values. The special case of Au, which is resists corrosion but is soft and has a low shear modulus, is discussed below.

Ni and the other metals in the table remain shiny because they form a thin protective oxide layer. Au remains shiny because it doesn't react at all with any of the constituents of air.

Au does, however, react (by rapid solid-state diffusion) with solid Sn to form an IMC. Ni reacts with Sn much more slowly than Au to form its IMC. The rate of thickness increase of any IMC drops as it gets thicker—a diffusing metal atom of both species must diffuse farther to encounter an atom of the other species.

Intermetallic compounds in general are stiff, not ductile. Suganuma et. al. found that the ultra-thin 50-nm Au cap converted entirely to the Au—Sn IMC in one day. Thus, this metal's penetrability value (i.e., 50 nm) actually applies to its IMC. At any rates a coating with an initial Ni thickness of 1 μm can be projected to retain a substantial thickness of unreacted metal after many decades.

2. What would Happen if all the Ni Did Get Used Up in Forming IMC?

Even in the unlikely event that IMC growth (Which consumes Sn as well as Ni) were accelerated by prolonged exposure to very high temperatures, for a Ni cap comparable to the typical 1 μm Sn termination finish thickness, disappearance of the would be accompanied by that of the Sn, and with that, any whisker risk.

Again, after soldering, tin's role of preserving the solderability of the termination's basis metal is no longer needed. Hence, its total consumption in the field by IMC growth would be of no concern.

If this (unusually hot) assembly included Pb free solder, the solder would of course remain after total loss of metallic Ni. But
1. Whiskers do not grow above about 75° C.
2. Pb-free solder's whisker growth risk is far lower than that of Sn termination finish.
3. It would still be capped—by a stiff, non-ductile, IMC layer.

3. Does a Cap Prevent Penetration, or Just Retard it?

Taken together, the data presented above provide compelling evidence that a metal's (or ceramic's, for that matter) whisker penetrability (i.e., the thinnest cap that remains unpenetrated), is unlike that of ordinary polymer conformal coatings, which are penetrated in no more than a few years. A metal's penetrability is a not matter of kinetics but a material attribute. Were the effect of the ultra-thin 35-nm Ni cap simply to retard whisker penetration, one would expect to observe first no whiskers, and then many short ones, penetrating it.

Intuition suggests that, whether practical for preventing penetration or not (and ignoring metals that themselves grow whiskers), each metal must have some minimum thickness needed to prevent, permanently, whisker penetration from underlying Sn. That is, no whisker could ever exert a strong enough force to displace the atoms of a thick-enough metal coating above it. Or, the whisker reacts instead to form an IMC. But the difference is immense between the penetrability of Cu and Pb on the one hand, and Ni, Pd, and $AuSn_2$ on the other.

For Ni, Pd, and Au, this minimum whisker-preventing thickness appears to be substantially thinner than 50 nm (just hundreds of atoms thick). There are no measurements, but for Cu and Pb it must be substantially greater than 1000 nm. In just three days, a whisker penetrated a 600-nm Cu ledge. The Cu was more than 17 times thicker than a Ni ledge that for over three months resisted penetration by all but one whisker. This difference supports the notion that some metal caps prevent, and not just retard, whisker penetration.

Clearly, the differences are huge. They show that among various metals, this attribute, like other physical attributes (e.g., hardness, ductility, shear modulus), differs immensely.

Porosity

A Ni cap has been found to be virtually pore-free when its thickness is not less than 1.24 μm (see "Sn Whisker Qualification Testing, Bath E," by Robert F. Hilty of Tyco Engineering, of Harrisburg, Pa.). Since the characteristic diameter of a pore in plating is far smaller than the diameter of a characteristic whisker, it is not known what effect, if any porosity in a Ni plating cap has in preventing whisker penetration.

The 200-nm Ni cap electrodeposited by Suganuma et al. was far thinner than the above-reported thickness, while the 50-nm cap was discontinuous. Hence it is reasonable to assume that the thicker cap was porous, yet it resisted whisker penetration.

Achieving a Shiny Appearance on Sn—Pb Solder

The natural appearance of a Ni cap Sn and Pb-free Sn is bright and shiny. On eutectic Sn—Pb solder, it is rather dull. This is not technically significant—the Pb in the solder itself inhibits the whisker risk.

A shiny final appearance of the solder connections, if desired, may be achieved by first depositing from an electroless Sn bath containing grain refiners a thin shiny cap onto the assembly's metal surfaces (including the solder—no more than 1 μm needed), before depositing the impenetrable cap.

Having described our invention we claim:

1. A process for inhibiting tin whisker growth on an electronic assembly, the process comprising: masking metal surfaces on an electronic assembly on which a metal cap layer is unwanted, the electronic assembly is a circuit board with one or more conductive board traces including lands, one or more components that have been previously attached to the lands with solder, the electronic assembly having at least one source of tin from: the conductive board traces, including lands, that are formed on a circuit board, the components with one or more terminations, for connecting to the lands, the terminations having a final finish deposited on the terminations, and the solder, which electrically and mechanically attaches the terminations to the lands; cleaning, including oxide removal, of exposed metal surfaces of the electronic assembly; immersing all of the exposed metal surfaces of the electronic assembly in an electroless metal plating bath; providing a dwell time of the electronic assembly in the bath to plate with the metal cap layer all exposed tin and tin alloy surfaces and the components that have been soldered, and the metal cap layer is one of gold, silver, platinum, nickel, or palladium; removing the electronic assembly from the bath; rinsing the electronic assembly and the metal cap layer; drying; and removing all masking.

2. The process of claim 1, wherein the dwell time of the assembly in the electroless metal plating bath is between one minute and one hour.

3. The process of claim 1, wherein the dwell time of the exposed metal surfaces of the assembly in the electroless metal plating bath creates a metal layer of at least 35 nanometers on the exposed metal surfaces.

4. The process of claim 1, further comprising: treating the exposed metal surfaces with at least one of chromate, trisodium phosphate, or combination thereof.

5. The process of claim 1, further comprising:
over-coating the metal cap layer with a conformal polymer coating.

6. The process of claim 1, further comprising:
depositing another metal cap layer onto the metal cap layer.

7. The process of claim 6, wherein the another metal cap layer is palladium.

8. The process of claim 1, wherein the metal cap layer is any metal that is deposited electrolessly and is whisker-impenetrable.

9. The process of claim 1, further comprising:
co-depositing two metals to form the metal cap layer.

10. The process of claim 1, further comprising:
depositing an under-layer of tin before depositing the metal cap layer.

11. A process for inhibiting tin whisker growth on an electronic assembly, the process comprising: masking metal surfaces on an electronic assembly on which a metal cap layer is unwanted, the electronic assembly is a circuit board with one or more conductive board traces including lands, one or more components that have been previously attached to the lands with solder, the electronic assembly having at least one source of tin from: the conductive board traces, including lands, that are formed on a circuit board, the components with one or more terminations, for connecting to the lands, the terminations having a final finish deposited on the terminations, and solder, which electrically and mechanically attaches the terminations to the lands; cleaning, including oxide removal with a ten percent solution of sulfuric acid, of exposed metal surfaces of the electronic assembly; immersing all of the exposed metal surfaces of the electronic assembly in an electroless metal plating bath; providing a dwell time of the electronic assembly in the bath to plate with the metal cap layer all exposed tin and tin alloy surfaces and the components that have been soldered, and the metal cap layer is consisting of a metal selected from gold, silver, platinum, nickel, or palladium; removing the electronic assembly from the bath; rinsing the electronic assembly and the metal cap layer; drying; and removing all masking.

12. The process of claim 11, wherein the exposed metal surfaces of the electronic assembly are treated using a trisodium phosphate solution prior to the cleaning with the ten percent solution of sulfuric acid.

13. The process of claim 11, further comprising:
over-coating the metal cap layer with a conformal polymer coating.

14. The process of claim 11, further comprising:
depositing another metal cap onto the metal cap layer.

15. The process of claim 14, wherein the another metal cap layer is palladium.

* * * * *